United States Patent [19]

Heinzler et al.

[11] Patent Number: 5,561,402
[45] Date of Patent: Oct. 1, 1996

[54] PULSE WIDTH MODULATION METHOD FOR TRIGGERING ANALOG ACTUATORS

[75] Inventors: Stefan Heinzler, Meckenbeuren; Herbert Jochum, Horgenzell, both of Germany

[73] Assignee: Temic Telefunken microelectronic GmbH, Heilbronn, Germany

[21] Appl. No.: 348,802

[22] Filed: Nov. 28, 1994

[30] Foreign Application Priority Data

Nov. 29, 1993 [DE] Germany ............... 43 40 520.7

[51] Int. Cl.$^6$ ................................. H03K 7/08
[52] U.S. Cl. .................. 332/109; 327/172; 327/175; 327/291; 375/238
[58] Field of Search ........................ 332/109, 110; 375/238; 327/172, 175, 291

[56] References Cited

U.S. PATENT DOCUMENTS

| | | | |
|---|---|---|---|
| 3,654,450 | 4/1972 | Webb | 235/197 |
| 4,754,466 | 6/1988 | McCambridge | 375/22 |
| 5,053,729 | 10/1991 | Babii | 332/109 |

FOREIGN PATENT DOCUMENTS

| | | |
|---|---|---|
| 0257820 | 3/1988 | European Pat. Off. . |
| 0443242 | 8/1991 | European Pat. Off. . |
| 3924652 | 1/1991 | Germany . |
| 4121736 | 1/1993 | Germany . |
| 4136980 | 5/1993 | Germany . |
| 4141093 | 6/1993 | Germany . |
| 1560233 | 1/1980 | United Kingdom . |

OTHER PUBLICATIONS

G. Turinsky: "Impulsbreitenmodulation mit B 555 D". In: radio fernsehen elektronik, Berlin 35, 1986, 1, pp. 56–57.
M. Heiss: "Pulsanzahlmodulator statt Pulsbreitenmodulator zur Verbesserung der Reglerdynamik". In: at–Automatisierungstechnik 41, 1993, 11, pp. 428–432.

*Primary Examiner*—Siegfried H. Grimm
*Attorney, Agent, or Firm*—Spencer & Frank

[57] ABSTRACT

For triggering analog actuators with pulse-width modulation, a pulse duty factor (TV) is specified as relative ratio of pulse time ($t_{PU}$) to period duration (T) of a triggering period. An add value (AW) is defined as product of the specified pulse duty factor (TV) and a maximum add value (AMW). Adding steps with specific cycle time ($t_z$) and specified add value (AW) in each case follow one another successively. In an adding step, the add value (AW) is added, using an adding element with memory function and overflow detection, to the value stored in the adding element. The result of the adding operation is stored as a new memory value in the adding element. The logic state at the output of the adding element is defined by the overflow that occurs in the adding step, and the actuator is triggered according to the respective logic state at the output of the adding element.

5 Claims, 1 Drawing Sheet

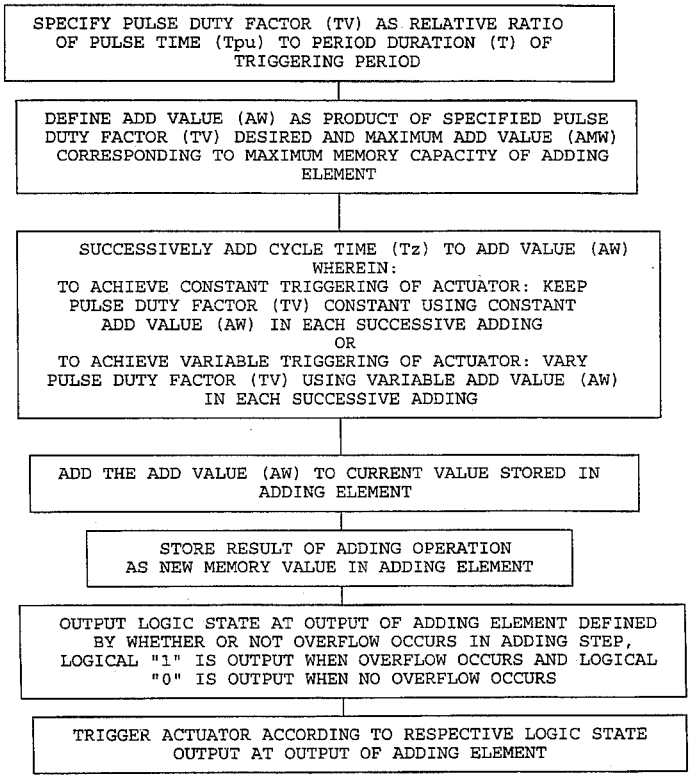

```
┌─────────────────────────────────────────────────────┐
│  SPECIFY PULSE DUTY FACTOR (TV) AS RELATIVE RATIO   │
│    OF PULSE TIME (Tpu) TO PERIOD DURATION (T) OF    │
│                  TRIGGERING PERIOD                  │
└─────────────────────────────────────────────────────┘
                          │
┌─────────────────────────────────────────────────────┐
│  DEFINE ADD VALUE (AW) AS PRODUCT OF SPECIFIED PULSE│
│  DUTY FACTOR (TV) DESIRED AND MAXIMUM ADD VALUE (AMW)│
│   CORRESPONDING TO MAXIMUM MEMORY CAPACITY OF ADDING│
│                       ELEMENT                       │
└─────────────────────────────────────────────────────┘
                          │
┌─────────────────────────────────────────────────────┐
│     SUCCESSIVELY ADD CYCLE TIME (Tz) TO ADD VALUE (AW)│
│                        WHEREIN:                     │
│   TO ACHIEVE CONSTANT TRIGGERING OF ACTUATOR: KEEP  │
│     PULSE DUTY FACTOR (TV) CONSTANT USING CONSTANT  │
│        ADD VALUE (AW) IN EACH SUCCESSIVE ADDING     │
│                           OR                        │
│   TO ACHIEVE VARIABLE TRIGGERING OF ACTUATOR: VARY  │
│   PULSE DUTY FACTOR (TV) USING VARIABLE ADD VALUE (AW)│
│              IN EACH SUCCESSIVE ADDING              │
└─────────────────────────────────────────────────────┘
                          │
┌─────────────────────────────────────────────────────┐
│   ADD THE ADD VALUE (AW) TO CURRENT VALUE STORED IN │
│                   ADDING ELEMENT                    │
└─────────────────────────────────────────────────────┘
                          │
┌─────────────────────────────────────────────────────┐
│            STORE RESULT OF ADDING OPERATION         │
│       AS NEW MEMORY VALUE IN ADDING ELEMENT         │
└─────────────────────────────────────────────────────┘
                          │
┌─────────────────────────────────────────────────────┐
│  OUTPUT LOGIC STATE AT OUTPUT OF ADDING ELEMENT DEFINED│
│     BY WHETHER OR NOT OVERFLOW OCCURS IN ADDING STEP,│
│   LOGICAL "1" IS OUTPUT WHEN OVERFLOW OCCURS AND LOGICAL│
│          "0" IS OUTPUT WHEN NO OVERFLOW OCCURS      │
└─────────────────────────────────────────────────────┘
                          │
┌─────────────────────────────────────────────────────┐
│   TRIGGER ACTUATOR ACCORDING TO RESPECTIVE LOGIC STATE│
│           OUTPUT AT OUTPUT OF ADDING ELEMENT        │
└─────────────────────────────────────────────────────┘
```

FIG. 1

PULSE WIDTH MODULATION METHOD FOR TRIGGERING ANALOG ACTUATORS

BACKGROUND OF THE INVENTION

Analog actuators (such as lamps or valves) must be set to specific analog values (which, for example, are a measure of the lamp brightness or valve opening). Triggering of the actuators for specifying the desired analog values (which are often different or variable) is generally accomplished by means of pulse-width modulation: the analog value is defined by a specific pulse duty factor (ratio between on-time or pulse-time and duration of trigger period), the pulse duty factor is given by the counter reading on a digital counter, the counter output is switched over on reaching the counter reading and the actuator is triggered according to the switched state of the counter output. Optionally, the digital output signal of the counter can be smoothed (by a filter, for example) and a controllable direct current can be generated for current-dependent triggering of the actuator. Triggering of the actuators with variable analog values is accomplished by altering the pulse duty factor through variation of the on-time/pulse-time while maintaining a constant trigger signal period; it is possible here for the pulse duty factor to vary in discrete steps with the step width of the counter.

However, the problems associated with the method described above are:

- the pulse duty factor must be loaded (into a memory, for example) after each trigger period;
- owing to the discrete steps of the counter and depending on specific characteristics pertaining to the system (for example, trigger signal period too long, counter step width too small, filter effect too slight) the on-times/off-times become noticeable (especially in the case of long no-pulse times or pulse times);
- an increase in the fundamental frequency or a reduction of the trigger signal period imposes a greater load on the pulse-width modulation and the effort required to set the required pulse duty factor increases.

SUMMARY OF THE INVENTION

The object of the invention is to provide a simple method for triggering analog actuators by means of pulse-width modulation, in which the disadvantages named above are avoided and displaying advantageous characteristics. In an exemplary embodiment of the inventive method for triggering analog actuators by means of pulse-width modulation, a pulse duty factor (TV) is specified as relative ratio of pulse time ($t_{PU}$) to period duration (T) of a triggering period. An add value (AW) is defined as the product of the specified pulse duty factor (TV) and a maximum add value (AMW). Adding steps with specific cycle time ($t_z$) and specified add value (AW) in each case follow one another successively. In an adding step, the add value (AW) is added (by an adding element with memory function and overflow detection) to the value stored in the adding element. The result of the adding operation is stored as a new memory value in the adding element. The logic state at the output of the adding element is defined by the overflow that occurs in the adding step, and the actuator is triggered according to the respective logic state at the output of the adding element.

In a further embodiment, in each adding step, a logical "1" is output at the output of the adding element when an overflow occurs, and a logical "0" when no overflow occurs.

The maximum add value (AMW) is defined by the maximum memory capacity of the adding element in a further embodiment.

In a further embodiment, for a constant triggering of the actuators, the pulse duty factor (TV), and thus the add value (AW), is specified as constant value in each adding step.

In a further embodiment, for a variable triggering of the actuators, the pulse duty factor (TV), and thus the add value (AW), can be specified as any value in each adding step.

BRIEF DESCRIPTION OF THE DRAWINGS

The above and other features of the invention will become apparent from the following detailed description taken with the drawings in which:

FIG. 1 is a flow chart illustration of an exemplary method according to the invention.

DETAILED DESCRIPTION OF THE PREFERRED EMBODIMENT

The invention will now be described in more detail by example with reference to the exemplary embodiment shown in the Figure. It should be kept in mind that the following described embodiment is only presented by way of example and should not be construed as limiting the inventive concept to any particular configuration. Reference is made to the flow chart of FIG. 1.

In the presented method, the pulse duty factor TV is defined as the ratio of an add value AW to a maximum add value AMW:

$$TV = \frac{AW}{AMW} \cdot 100\ [\%]; \tag{1}$$

where the maximum add value AMW is determined, for example, by the number of memory locations available.

In successive adding steps (adding cycle time: $t_z$) the add value AW is added to the previous memory value by virtue of an adding element with a memory function and overflow detection, the result of addition is stored as a new memory value and the actuator is triggered from the overflow of the adding element: if an overflow occurs in the adding step, a specific logic state is output at the signal output (for example, a logical "1") corresponding to a pulse time $t_{PU}$/on-time; otherwise the complementary logic state is output (for example, a logical "0") corresponding to a no-pulse time $t_{PA}$/off-time. For example, a desired pulse duty factor of 50% is accomplished for a maximum add value AMW of 100 units in accordance with equation (1) by the add value AW=TV·AMW =50 so that (with a step width of one unit) a logical "1" and a logical "0" are output alternately in successive adding steps.

The pulse duty factor TV can be determined on expiration of adding cycle time $t_z$·AMW from equation (1). The triggering period duration T (averaged over adding cycle time $t_z$·AMW) as the sum of pulse time $t_{PU}$ and no-pulse time $t_{PA}$ also depends on the add value AW and the maximum add value AMW:

$$T = t_{PU} + t_{PA} = t_z \cdot \left( \frac{AMW}{AW} \right) \quad \text{for } AW \leq \frac{AMW}{2} \tag{2a}$$

$$T = t_{PU} + t_{PA} = t_z \cdot \left( \frac{AMW}{AMW - AW} \right) \quad \text{for } AW \geq \frac{AMW}{2} \tag{2b}$$

where, as already stated, $t_z$ is the cycle time for the adding step.

With uniform triggering of the actuator, the pulse duty factor TV and hence in accordance with equation (1) also the add value AW is held constant in all cycle times $t_z$. For example, the constant pulse duty factor TV of 25% is to be set by means of a register in byte format with 256 memory locations (step width=1) and an adding cycle time $t_z$ of 1 ms. For this purpose, the add value AW=TV·AMW=64 in accordance with equation (1) is added into the register each time in successive adding steps; thus, with every fourth adding step there is an overflow resulting in a series of no-pulse times $t_{PA}$ and pulse times $t_{PU}$ each having a duration of $t_{PA}$=3 ms and $t_{PU}$=1 ms and consequently the desired pulse duty factor of TV=25%. The (constant) period T as sum of no-pulse time $t_{PA}$ and pulse time $t_{PU}$ is in this case T=14 ms in accordance with equation (2a).

For variable triggering of the actuator, the analog value of the actuator, and thus also the pulse duty factor TV and the add value AW, must be altered for the adding step concerned: if the pulse duty factor TV is to be incremented or decremented, the add value AW is incremented or decremented in accordance with the equation (1), resulting in a variation in the frequency of an overflow in the subsequent adding steps; in particular, timed automatically controlled operations (such as the duration of a dimming operation) can be controlled by supplying a specific timing behavior when the pulse duty factor TV is altered. In one embodiment example of this—the dimmed triggering of an interior light bulb in a motor vehicle—the pulse duty factor TV is varied from 100% (lamp always on) to 0% (lamp always off). For this purpose, in a register with 256 memory locations, the step value 1 and the cycle time $t_2$=1.25 ms are added successively to the memory value at time intervals of add value AW decremented by 1.25 ms in each case.

The presented method combines several advantages:
 the distribution of pulse times/no-pulse times for triggering the actuators is optimum;
 the maximum possible fundamental frequency is set (for a given pulse duty factor), which means that on/off states are no longer visible;
 any timing behavior can be specified for the pulse-width modulation, and in particular a fast response to desired changes is possible.

What is claimed is:

1. A method for triggering analog actuators by means of pulse-width modulation, the method comprising an initialization step, wherein:
 a) a pulse duty factor (TV) is specified as the relative ratio of pulse time ($t_{PU}$) to period duration (T) of a triggering period;
 b) an add value (AW) is defined as the product of the specified pulse duty factor (TV) desired and a maximum add value (AMW);
 c) a plurality of adding steps are executed with a specific cycle time ($t_z$) and a specified add value (AW) in each case successively;
 the method further comprising repetitively:
 adding, in the adding steps with an adding element having memory function and overflow detection, the add value (AW) to the current value stored in the adding element,
 storing the result of the adding operation as a new memory value in the adding element,
 outputting a logic state at the output of the adding element, the logic state being defined by whether or not an overflow occurs in the adding step, and
 triggering the actuator according to the respective logic state output at the output of the adding element.

2. The method in accordance with claim 1, wherein in each outputting step, a logical "1" is output at the output of the adding element when an overflow occurs in the adding step, and a logical "0" is output at the output of the adding element when no overflow occurs in the adding step.

3. The method in accordance with claim 1, wherein the maximum add value (AMW) corresponds to the maximum memory capacity of the adding element.

4. The method in accordance with claim 1, wherein, to achieve a constant triggering of the actuator, the pulse duty factor (TV) is kept constant by using a constant add value (AW) in each successive adding step.

5. The method in accordance with claim 1, wherein, to achieve a variable triggering of the actuator, the pulse duty factor is set to vary by using a variable add value (AW) in each successive adding step.

* * * * *